United States Patent
Sumesaglam

(10) Patent No.: US 7,362,153 B2
(45) Date of Patent: Apr. 22, 2008

(54) RECEIVER LATCH CIRCUIT AND METHOD

(75) Inventor: Taner Sumesaglam, Folsom, CA (US)

(73) Assignee: Intel Corporation, Santa Clara, CA (US)

(*) Notice: Subject to any disclaimer, the term of this patent is extended or adjusted under 35 U.S.C. 154(b) by 30 days.

(21) Appl. No.: 11/415,590

(22) Filed: May 1, 2006

(65) Prior Publication Data
US 2007/0252630 A1    Nov. 1, 2007

(51) Int. Cl.
*H03K 3/289* (2006.01)

(52) U.S. Cl. .................. 327/202; 327/212; 327/52; 327/57

(58) Field of Classification Search ............. None
See application file for complete search history.

(56) References Cited

U.S. PATENT DOCUMENTS

| | | | |
|---|---|---|---|
| 5,506,524 A * | 4/1996 | Lin ........................... | 327/57 |
| 5,963,060 A | 10/1999 | Varadarajan et al. | |
| 6,191,629 B1 | 2/2001 | Bisanti et al. | |
| 6,519,196 B1 | 2/2003 | Jang et al. | |
| 6,643,200 B2 | 11/2003 | Clark et al. | |
| 6,717,448 B2 | 4/2004 | Heo et al. | |
| 6,803,794 B2 * | 10/2004 | Martin et al. ............. | 327/52 |
| 7,221,605 B2 * | 5/2007 | Forbes ....................... | 365/205 |

OTHER PUBLICATIONS

Farjad-Rad, et al., "0.622-8.0Gbps 150mW Serial IO Macrocell with Fully Flexible Preemphasis and Equalization," 2003 Symposium on VLSI Circuits Digest of Technical Papers, pp. 63-66.

Lau, et al., "A 2.6-GByte/s Multipurpose Chip-to-Chip Interface," IEEE Journal of Solid-State Circuits, vol. 33, No. 11, Nov. 1998, pp. 1617-1626.

International Search Report issued in International Application No. PCT/US2007/067924, mailed Oct. 9, 2007, 4 pp.

* cited by examiner

*Primary Examiner*—N. Drew Richards
*Assistant Examiner*—An T. Luu
(74) *Attorney, Agent, or Firm*—Schwabe, Williamson & Wyatt, P.C.

(57) ABSTRACT

In some embodiments, a receiver latch circuit, includes a dynamic latch having at least one input terminal to receive an input data signal and at least one latch terminal. The dynamic latch is adapted to generate an amplified output data signal based at least in part on the input data signal. The dynamic latch includes at least one capacitor, coupled between the at least one input terminal and the at least one latch terminal, to reduce intersymbol interference in the input data signal.

19 Claims, 5 Drawing Sheets

RECEIVER LATCH CIRCUIT AND METHOD

BACKGROUND

1. Technical Field

Embodiments of the present invention are related to the field of electronic devices, and in particular, to data receivers.

2. Description of Related Art

Receiver latch circuits (sense amplifiers) are extensively used in integrated circuits (ICs) both for inter-chip and off-chip signaling. A transmitter circuit (driver) sends binary data signals through a transmission line (interconnect) to the receiver latch circuit. Since the transmission line may be a lossy channel, data transfer through the transmission line at high rates may result in frequency-dependent attenuation or loss which causes signal distortion in the form of intersymbol interference (ISI). Equalization of the data signal may be needed to reduce the ISI.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

Figure 1:
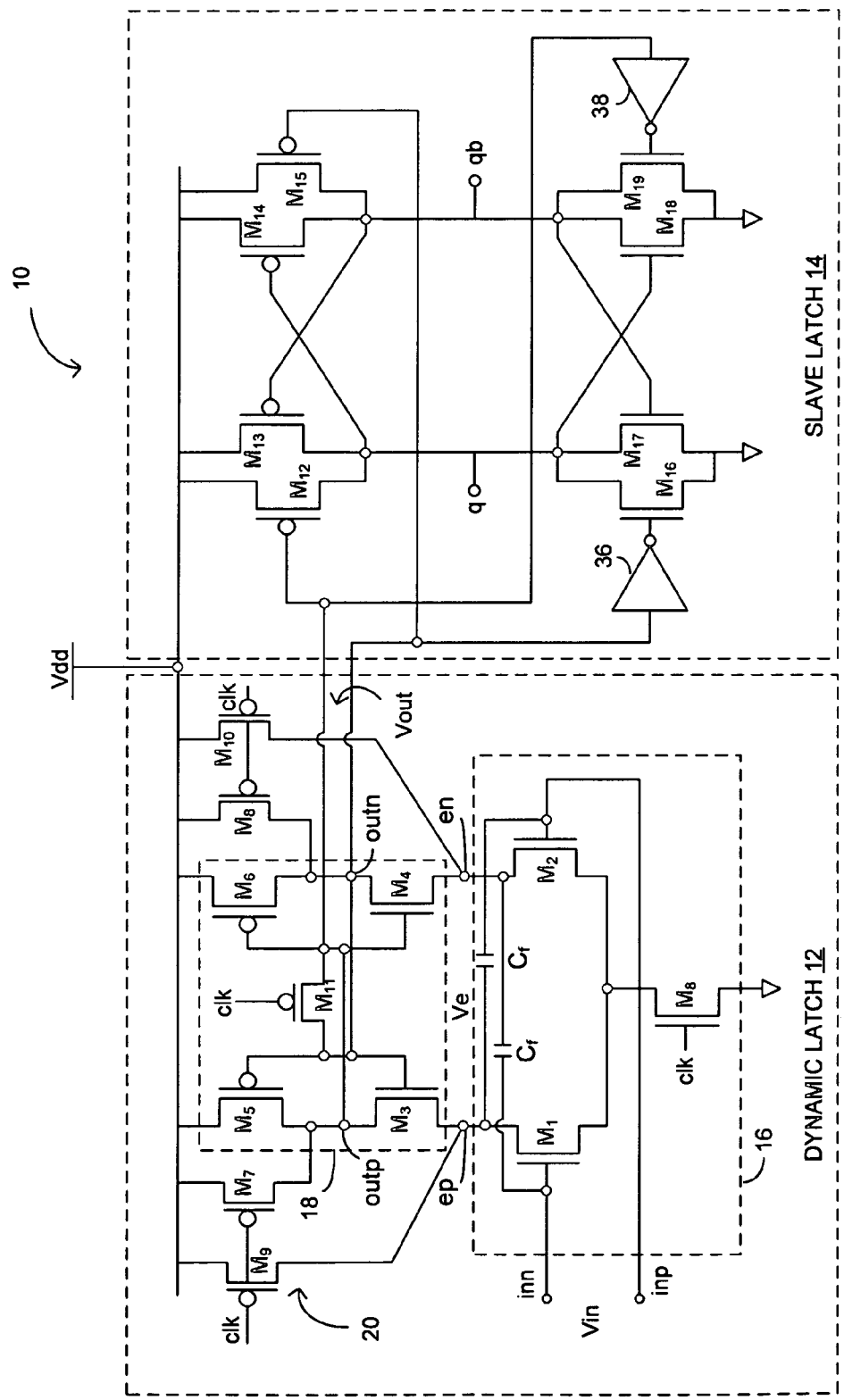
FIG. 1 is a circuit schematic of a receiver latch circuit, according to some embodiments of the present invention.

With reference to FIG. 1, there is illustrated a receiver latch circuit 10, according to some embodiments of the present invention. In some embodiments, the receiver latch circuit 10 may have two stages, a master dynamic latch 12 and a slave static latch 14 coupled to the dynamic latch 12. The dynamic latch 12 may amplify a received input data signal Vin on the rising edge of a clock signal clk to generate amplified output data signal Vout and may hold the output data signal Vout for half of a clock period of the clock signal clk. The slave latch 14 may receive the output data signal from the dynamic latch 12 and may hold (latch) it valid for a whole clock period. The dynamic latch 12 includes frequency selective amplification using feed-forward capacitance, which may provide built-in continuous-time equalization for the received input data signal Vin. The feed-forward capacitance may generate a zero in a transfer function for the dynamic latch 12, as will be described in detail hereinafter. This added capacitance helps to equalize the attenuation caused by the ISI, which may result in a flatter overall frequency response with reduced signal distortion.

In some embodiments, the input data signal Vin may be a small swing or low voltage swing signal. The voltage of the small swing, data input signal Vin may have been reduced so that when it is transmitted over an interconnect to the receiver latch circuit 10, performance is improved. The receiver latch circuit 10 may restore the input data signal Vin to a full rail-to-rail ("full rail") output data signal Vout. In some embodiments, the input signal may be a differential signal, where both the data signal and its complement are transmitted, as shown in FIG. 1. In these embodiment, the receiver latch circuit 10 detects a relative change in voltage between two interconnect wires, with the input data signal Vin being applied across the two interconnect wires and therefore across illustrated input nodes inn and inp in FIG. 1. Hence, the value of the input data signal Vin may be the voltage difference between a voltage Vinn at node inn and a voltage Vinp at node inp, where the last letter "n" or "p" stands for negative or positive, respectively.

In some embodiments, the receiver latch circuit 10 may use a single-ended approach, where the receiver latch circuit 10 detects an absolute change in voltage on a single interconnect wire; hence, the input data signal may be a single-ended signal. In some embodiments, the input data signal Vin may be a non-multiplexed signal and only be coupled to a single receiver latch circuit 10, as shown in FIG. 1. In some embodiments, the input data signal Vin may be a multiplexed signal; hence, there may be a set of receiver latch circuits 10 that may be used in demultiplexing the input data signal Vin.

In some embodiments, the dynamic latch 12 may include an evaluation circuit 16 to receive the input data signal Vin, an amplifying circuit 18 coupled to evaluation circuit 16, and a precharge circuit 20 coupled to the outputs of the evaluation circuit 16 and the amplifying circuit 18. Each of these circuits 16, 18, and 20 may include one or more transistors, as will be described hereinafter in detail. In general, the receiver latch circuit 10 may have three distinct periods of operations: a precharge period, an evaluation period, and an amplification and latching period.

In some embodiments, precharging of the dynamic latch 12 by the precharge circuit 20 may occur as long as the clock signal clk is low (first clock phase), which defines a precharge period. During the precharge period, the output data signal Vout may be shorted to a supply voltage Vdd. The output data signal Vout is the voltage across output nodes outn and outp (output terminals of the dynamic latch 12). The parasitic capacitances associated with the output nodes outn and outp and the sense nodes en and ep may be precharged. In general, any components connected to these nodes may contribute to the capacitance that is precharged.

In some embodiments, two interconnect lines may be coupled to the input nodes (terminals) inn and inp of the evaluation circuit 16 to apply the input data signal Vin. As the clock signal clk transitions from low to high, an evaluation period may be initiated by the rising edge of the clock signal. During the evaluation period, the input data signal Vin may be evaluated by the evaluation circuit 16 to produce at its sense nodes en and ep (sense output terminals of evaluation circuit 16) a sensed data signal Ve, which is the voltage difference across the sense nodes en and ep.

The amplifying circuit 18 may amplify the sensed data signal Ve to a full rail-to-rail, output data signal Vout and may hold (latch) the signal Vout during a second clock phase of the clock signal clk. More specifically, the amplifying circuit 18 may increase the output signal Vout with a strong positive feedback, as will be described hereinafter. The beginning of the amplification of the sensed signal Ve ends the evaluation period and begins amplification and latching period. Thereafter, the slave latch 14 may latch the output data signal Vout for a whole clock period of the clock signal clk.

In the receiver latch circuit 10, according to some embodiments of the present invention, equalization is implemented in the first stage, the dynamic latch 12. Although the receiver latch circuit 10 is essentially a non-linear circuit, during the evaluation period, the receiver latch circuit 10 may essentially operate in a linear manner to the first order and may be exploited to implement continuous-time equalization. In some embodiments, the dynamic latch 12 may include the previously-mentioned feed-forward capacitance in the form of one or more capacitors Cf. The capacitor Cf may be lumped capacitor; however, the capacitor Cf may also be implemented in a number of other different ways, such using a transistor or metals or other alternatives.

The capacitor(s) Cf may be incorporated into the dynamic latch 12 in a number of different ways. FIG. 1 illustrates one example for the incorporating of a pair of capacitors Cf where differential signaling is used. The pair of capacitors Cf may be coupled between input terminals (nodes inn and inp) and sense terminals (nodes en and node ep) of the evaluation circuit 16. More specifically, the first capacitor Cf may be coupled between the negative input node inn and the negative sense node en and the second capacitor Cf may be coupled between the positive input node inp and the positive sense node ep. Hence, the capacitors Cf may be coupled between nodes having the same polarity.

Figure 2:
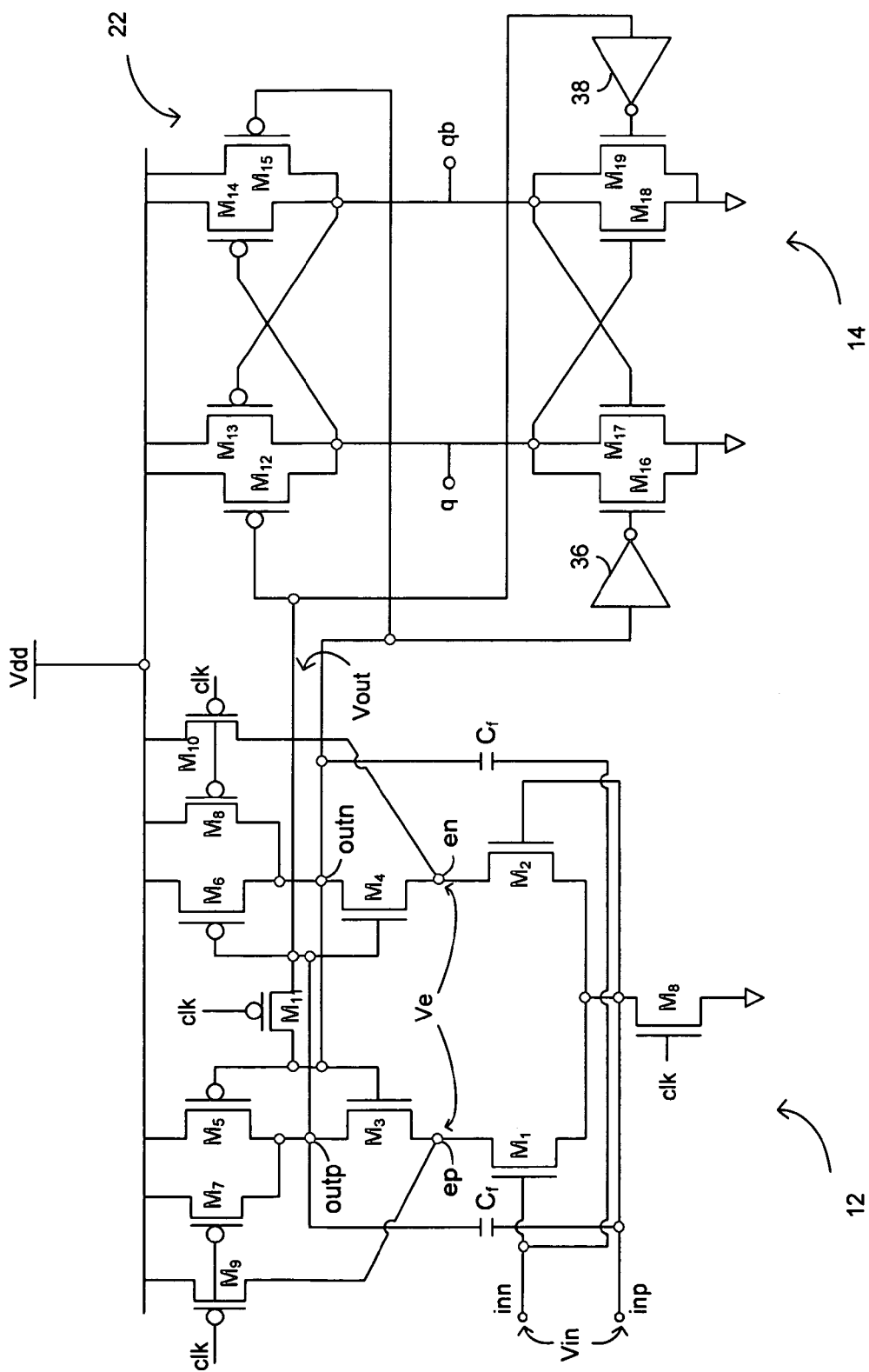
FIG. 2 is a circuit schematic of another receiver latch circuit, according to some embodiments of the present invention.

Referring to FIG. 2, there is illustrated a receiver latch circuit 22, according to another embodiment of the present invention. The receiver latch circuit 22, which also uses differential signaling, incorporates an alternative coupling configuration for the pair of capacitors Cf. The first capacitor Cf may be coupled between the negative input node inn and the negative output node outn and the second capacitor Cf may be coupled between the positive input node inp and the positive output node outp. Again, the capacitors Cf may be coupled between nodes having the same polarity. The remainder of the receiver latch circuit 22 of FIG. 2 is the same as the receiver latch circuit 10 of FIG. 1; hence, the reference numbers remain the same and the rest of the receiver latch circuit 22 will not be explained, since it operates in the same manner as the receiver latch circuit 10 of FIG. 1.

In other embodiments, when the input data signal is a single ended signal, the evaluation circuit may have only one input signal and one input terminal (node); hence, only one of the illustrated capacitors Cf may be needed. In some embodiments, the capacitor Cf may be coupled from the single input terminal to a sense terminal of the evaluation circuit. Again, the capacitor Cf may be coupled between terminals that have the same polarity. If the logic of the single ended evaluation circuit is non-inverting, then the capacitor Cf may be coupled from the single input of the evaluation circuit to a non-inverted sense terminal of the evaluation circuit. If the logic of the single ended evaluation circuit is inverting, then the capacitor Cf may be coupled from the input terminal to a logical complement of the non-inverted sense terminal of the evaluation circuit. Likewise, the capacitor may be coupled to the output of the single ended dynamic latch. If the logic of the single ended dynamic latch circuit is non-inverting, then the capacitor Cf may be coupled from the single input of the evaluation circuit to a non-inverted output terminal of the single ended dynamic latch. If the logic of the single ended dynamic latch is inverting, then the capacitor Cf may be coupled from the input terminal to a logical complement of the non-inverted output terminal of the dynamic latch.

Summarizing the positioning of the capacitor Cf(s) within the dynamic latch 12, at least one capacitor Cf is coupled between at least one input node (input terminal) of the dynamic latch and at least one "latch node" or "latch terminal", where the latch node/terminal is a sense node (output sense terminal of evaluation circuit 16) or an output node (output terminal of dynamic latch 12). With differential signaling, a pair of the capacitors Cf may be coupled between the input nodes and the sense nodes (a pair of "latch terminals"), as illustrated in FIG. 1. Alternatively, the pair of capacitors Cf may be coupled between the input nodes and the output nodes (a pair of "latch terminals"), as illustrated in FIG. 2. With single-ended signaling, a single capacitor Cf may be coupled between a single input node and a single sense node (a single "latch terminal") or a single output node (single "latch terminal"). In each of these configurations, the capacitor(s) may be coupled between nodes/terminals of the same polarity. The terms "node" and "terminal" may be used interchangeably, since each node mentioned herein is located at either an input or an output terminal of the evaluation circuit 16 or the amplifying circuit 18.

Figure 3:
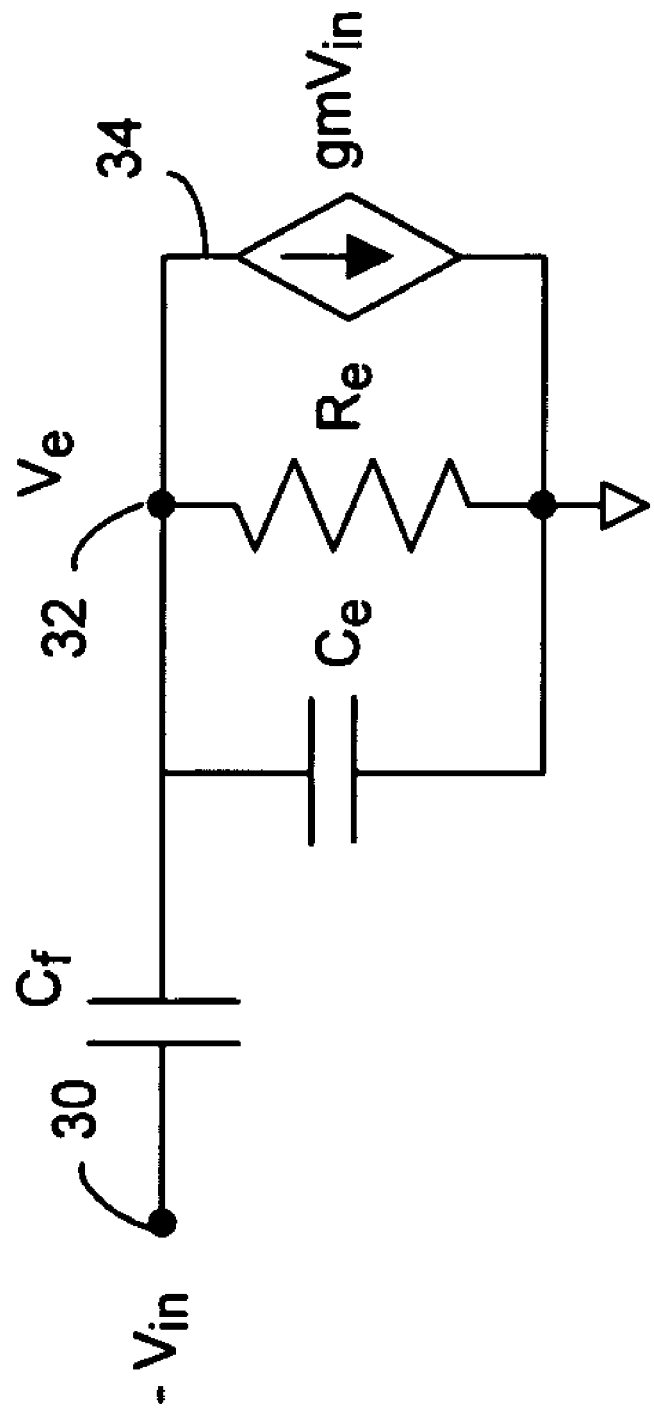
FIG. 3 is a small signal model of an evaluation circuit shown in FIG. 1, according to some embodiments of the present invention.

FIG. 3 illustrates a differential mode small-signal model of the evaluation circuit 16 of FIG. 1. This model provides analysis of the input data signal Vin and the sensed data signal Ve during the evaluation period. At an input node 30 (combination of nodes inn and inp of FIG. 1), the input data signal Vin is applied. The input node 30 may be coupled through the capacitor Cf (combination of capacitors Cf of FIG. 1) to a sense node 32 (combination of sense nodes en and ep of FIG. 1), with the sense node 32 having the sensed data signal Ve. Transistors M1 and M2 of the evaluation circuit 16 may act as transconductors, in that they convert gate-to-source voltages Vgs to drain currents. In other words, the drain currents of transistors M1 and M2 are proportional to the voltage applied to the gates of M1 and M2. The transistors M1 and M2 may introduce an inversion between their gates and their drains. The combined drain currents of the transistors M1 and M2 are shown by a circuit line 34, which illustrates that the drain currents may be a function of the change in input data signal Vin and the transconductance gm of the transistors. Capacitance Ce, resistance Re (Re=1/Ge) and the circuit line 34 may be shown in parallel coupled between the sense node 32 and ground. The capacitance Ce and the conductance Ge are parasitic capacitance and conductance of the sense node 32, respectively.

With respect to the feed-forward capacitors Cf, a transfer or response function Heq for the evaluation circuit 16 from the input node 30 to the sense node 32 may be:

$$Heq \approx \frac{Ve}{Vin} = -\frac{gm + s \cdot 2 \cdot Cf}{Ge + s(2 \cdot Cf + Ce)}$$

where s is a complex frequency variable. The s values in the numerator represent zeros of the transfer function, whereas the s values in the denominator represent poles of the transfer function. The evaluation circuit 16 without the capacitance Cf is a wide band amplifier with one high frequency pole and may pass signals without substantial degradation within that bandwidth. The capacitor Cf adds a zero to the transfer function Heq at high frequency, which extends the bandwidth for passing signals by providing additional gain for high frequency signals. The capacitor Cf may provide a short impedance path for high frequency signals with increased gain, while it does not affect low frequency signals. When the capacitors Cf are coupled between the input nodes inn and inp and the output nodes outp and outn, respectively, as shown in FIG. 2, then a substantially same zero may be generated in the transfer function Heq≈Vout/Vin.

In some embodiments, the capacitors Cf may be 100 fF, but this value is merely illustrative of one of many possible values, with such values being dependent in part on upon the application. In some embodiments, the capacitors may be programmable; that is, a variable capacitance Cf may allow for different equalization amounts. A variable capacitance Cf may be of use when the same IC chip (with one or more of the receiver latch circuits) is used with different applications such as mobile, server, desktop computers. The different applications may result in different channel loss and ISI.

Referring back to FIG. 1, the receiver latch circuit 10 will now be described in further detail. This description will also describe the receiver latch circuit 22 of FIG. 2. In some embodiments, the receiver latch circuit 10 may also be referred to as a latching sense amplifier, and the dynamic latch 12 may also be referred to as a strong arm latch. In some embodiments, the receiver latch circuit 10 may use complementary metal oxide semiconductor (CMOS) technology.

In some embodiments, the evaluation circuit 16 may include N-type transistors M1, M2, and MB. The gates of M1 and M2 may be coupled to the input data signal Vin and the gate of MB may be coupled to the clock signal clk. The sources of M1 and M2 may be coupled to the drain of MB and the source of MB may be coupled ground. The drains of M1 and M2 may be coupled to the sense nodes en and ep, respectively.

In some embodiments, the amplifying circuit 18 may include N-type transistors M3 and M4 and P-type transistors M5, M6 and M11. The drains of M3 and M4 may be coupled to the sense nodes en and ep and the drains of M5 and M6 may be coupled to the sources of M3 and M4 through the output nodes outn and outp, respectively. The sources of M5 and M6 may be coupled to the voltage supply source Vdd. The gates of M3 and M5 may be coupled together and the gates of M4 and M6 may be coupled together. M11 may tie together all four gates M3-M6 when in its conductive state, with its gate being coupled to clk. Output node outn also may be coupled to the gates of M3 and M5, whereas output node outp also may be coupled to the gates M4 and M6.

The precharge circuit 20 may include P-type transistors M7, M8, M9, and M10, all with their sources coupled to the voltage source Vdd and their gates coupled to clk. M7 and M8 may have their drains coupled to the output nodes outp and outn, respectively, and M9 and M10 may have their drains coupled to the sense nodes en and ep, respectively.

In some embodiments, the slave latch 14 may be a set-reset (SR) latch. The shave latch 14 is shown with P-type transistors M12-M15, N-type transistors M16-19, and two inverters 36 and 38. As previously described, the slave latch 14 may latch the output signal Vout for a whole clock period. A rail-to-rail, latched output data signal is provided at nodes q and qb of the slave latch 14. The truth chart for a SR latch is as follows, wherein in and ip are negative and positive inputs of this stage (or outputs of first stage at the nodes outp and outn, respectively):

| in | ip | q |
|----|----|----|
| 0 | 0 | not possible |
| 0 | 1 | 0 |
| 1 | 0 | 1 |
| 1 | 1 | hold |

Referring to FIG. 1 and a flow chart of FIG. 4, the operation of the receiver latch circuit of FIG. 1 will now be described in more detail. In a precharging operation 40 of FIG. 4, when clock signal clk is low during the precharge period, the P-type transistor switches M9, M7, M5 and M6, M8, and M10 are closed and short the internal nodes outn, outp, en and ep, respectively, to supply voltage Vdd. This performs a precharge operation, wherein these nodes are precharged to the supply voltage level Vdd. During this low clock period, the gates of transistors M5, M6, M3 and M4 may be coupled together by transistor switch M11. During this low clock period, the N-type transistor switch MB may be opened; hence, the charge at the internal nodes outn, outp, en and ep cannot be discharged to ground.

Figure 4:
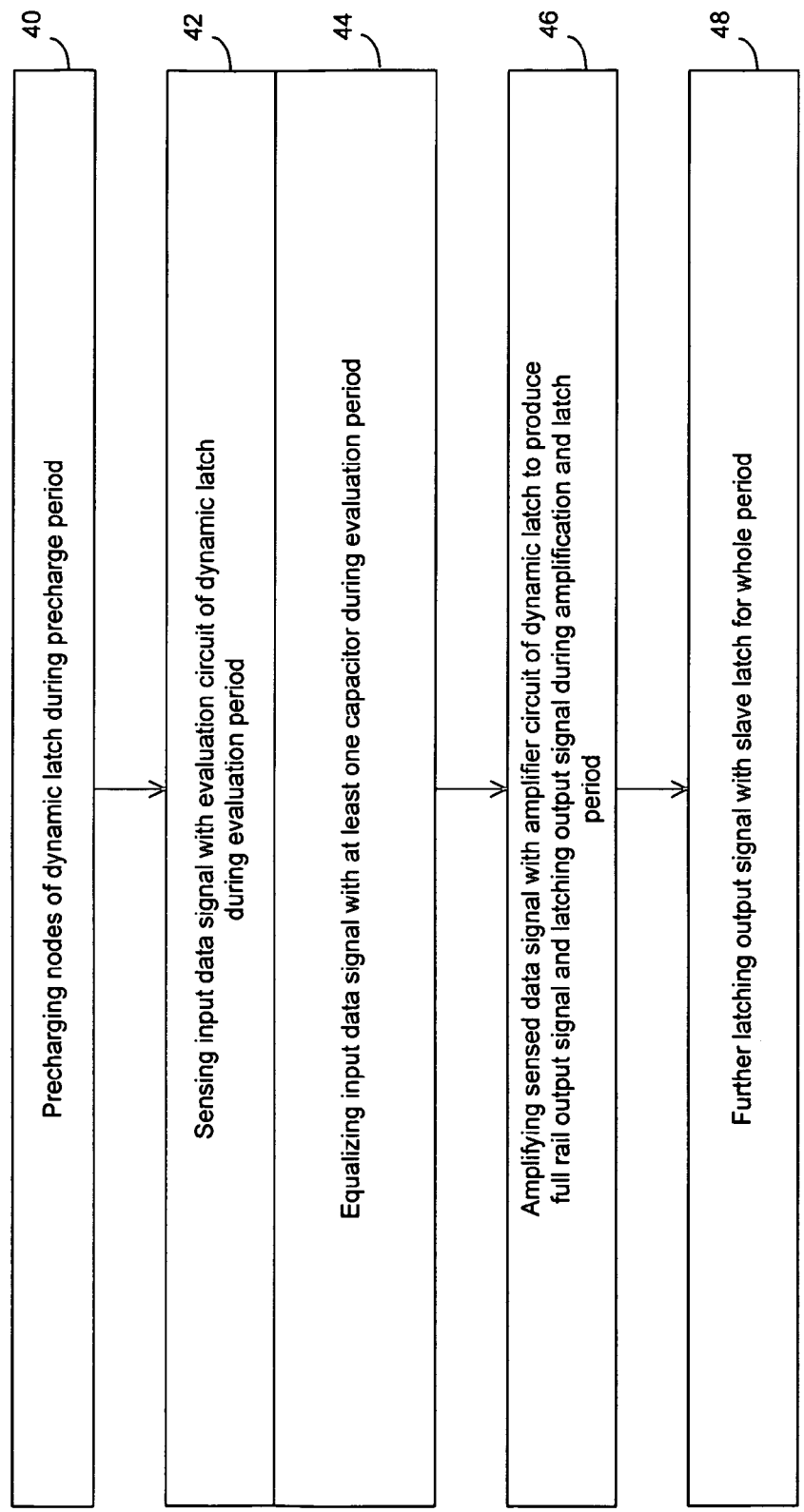
FIG. 4 is a flow chart of the operation of the receiver latch circuit of FIGS. 1 and 2, according to some embodiments of the present invention.

After internal output nodes outn and outp are sufficiently precharged while the clk is low, in a sensing operation 42 of FIG. 4, an evaluation period starts as clk transitions high. Transistor MB is closed (conductive state) to allow discharge to ground, whereas M9, M7, M6, M8 are opened (non-conductive state) to prevent further pre-charging. The charges at the sense nodes en and ep discharge with different speed because the gate voltages of M1 and M2 are different, with that difference being determined by the input voltage Vin. M1 converts the voltage Vinn into a current that discharges sense node en and output node outn, whereas M2 converts the voltage Vinp into a current that discharges the sense node ep and the output node outp. With one current being larger, its associated nodes discharge faster; hence, this enables latching in one direction. The voltages at the nodes en and ep are complements of each other at the end of evaluation.

In an equalization operation 44 of FIG. 4 concurrent with the sensing operation 42 of FIG. 4, the inclusion of the previously-described at least one capacitor Cf allows for the previously described equalization during the evaluation period when the dynamic latch 12 operates in a substantially linear manner. In an amplification and latching operation 46, once the lower voltage of node outn and node outp reaches the appropriate voltage level, the corresponding P-type transistor, one of transistors M5 and M6, will turn on, pulling the higher voltage of nodes outn or outp towards the supply voltage Vdd. This provides full rail amplification. When M5 or M6 is triggered, the evaluation ends; hence, the evaluation period ends and the amplifying and latching period begins. In another latching operation 48, the slave latch 14 latches the output data signal Vout for a whole period of the clock signal clk.

Figure 5:
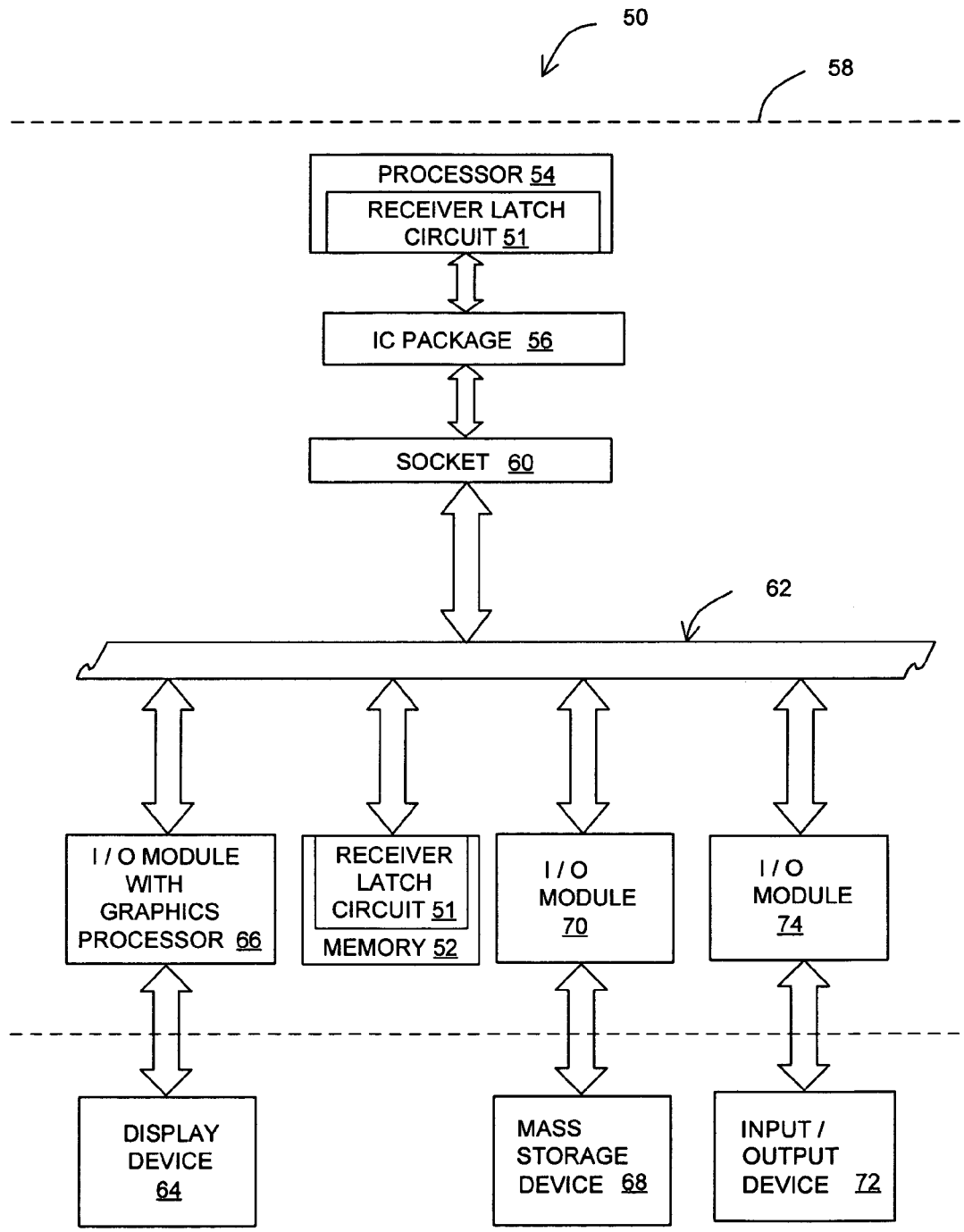
FIG. 5 is a system incorporating one or more receiver latch circuits of FIG. 1 or 2, according to some embodiments of the present invention.

Referring to FIG. 5, there is illustrated a computer system 50, according to some embodiments of the present invention, which is one of many possible systems in which one or more receiver latch circuits 51 may be used. In some embodiments, each of the receiver latch circuits 51 may be the receiver latch circuit 10 of FIG. 1 or the receiver latch circuit 22 of FIG. 2. In some embodiments, the receiver latch circuit 51 may use single-ended signaling. In some embodiments, one or more the receiver latch circuits 51 may be used in a memory chip 52, and/or one or more receiver latch circuits 51 may be used in a processor chip 54. In some embodiments, the one or more receiver latch circuits may be used in other integrated circuit (IC) chips of the computer system 50. ICs, such as the memory chip 52 and the processor chip 54, may have upwards of several hundred transmission lines in input/output buses with associated transmitter (driver), receiver, and/or transceiver circuits. In some embodiments, the receiver latch circuit 51 may receive off-chip signals and/or on-chip (inter-chip) signals. In other words, the driver transmitting the input data signal to the receiver latch circuit 51 may be in the same chip (on-chip signals) or different chip (off chip signals). The receiver latch circuit 51 is applicable to systems other than computer systems, and the computer system 50 is merely illustrative of one application.

In the system 50, an IC package 56 is mounted on a substrate or printed circuit board (PCB) 58 via a socket 60. The PCB 58 may be a motherboard. In addition to the socket 60 and the IC package 56, the PCB 58 may have mounted thereon the main memory 52 and a plurality of input/output (I/O) modules for external devices or external buses, all coupled to each other by a bus system 62 on the PCB 58. More specifically, the system 50 may include a display device 64 coupled to the bus system 62 by way of an I/O module 66, with the I/O module 66 having a graphical processor and a memory. The I/O module 66 may be mounted on the PCB 58 or may be mounted on a separate expansion board. The system 50 may further include a mass storage device 68 coupled to the bus system 62 via an I/O module 70. Another I/O device 72 may be coupled to the bus system 62 via an I/O module 74. Additional I/O modules may be included for other external or peripheral devices or external buses.

Examples of the main memory 52 include, but are not limited to, static random access memory (SRAM) and dynamic random access memory (DRAM). Examples of the mass storage device 68 include, but are not limited to, a hard disk drive, a compact disk drive (CD), a digital versatile disk driver (DVD), a floppy diskette, a tape system and so forth. Examples of the input/output devices 72 may include, but are not limited to, devices suitable for communication with a computer user (e.g., a keyboard, cursor control devices, microphone, a voice recognition device, a display, a printer, speakers, and a scanner) and devices suitable for communications with remote devices over communication networks (e.g., Ethernet interface device, analog and digital modems, ISDN terminal adapters, and frame relay devices). In some cases, these communications devices may also be mounted on the PCB 58. Examples of the bus system 62 include, but are not limited to, a peripheral control interface (PCI) bus, and Industry Standard Architecture (ISA) bus, and so forth. The bus system 62 may be implemented as a single bus or as a combination of buses (e.g., system bus with expansion buses). Depending upon the external device, I/O modules internal interfaces may use programmed I/O, interrupt-driven I/O, or direct memory access (DMA) techniques for communications over the bus system 62. Depending upon the external device, external interfaces of the I/O modules may provide to the external device(s) a point-to point parallel interface (e.g., Small Computer System Interface—SCSI) or point-to-point serial interface (e.g., EIA-232) or a multipoint serial interface (e.g., FireWire). Examples of the IC processor chip 54 may include any type of computational circuit such as, but not limited to, a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A receiver latch circuit, comprising:
   a dynamic latch including at least one input terminal to receive an input data signal and at least one latch terminal, the dynamic latch being adapted to generate an amplified output data signal based at least in part on the input data signal;
   the dynamic latch including at least one capacitor, coupled between the at least one input terminal and the at least one latch terminal, to reduce intersymbol interference in the input data signal;
   the dynamic latch further including an evaluation circuit having the at least one input terminal and at least one sense terminal and adapted to generate a sensed data signal on the at least one sense terminal; an amplifying circuit, coupled to the at least one sense terminal and including at least one output terminal, and adapted to generate the output data signal based at least in part on the sensed data signal; and a precharge circuit, coupled to the at least one sense terminal and the at least one output terminal, to precharge the at least one sense terminal and the at least one output terminal.

2. The receiver latch circuit according to claim 1, wherein the at least one capacitor is coupled to the dynamic latch to generate a zero in a transfer function of the dynamic latch.

3. The receiver latch circuit according to claim 1, wherein the at least one latch terminal includes at least one output terminal of the dynamic latch, with the at least one output terminal having the amplified output data signal thereon.

4. The receiver latch circuit according to claim 1, wherein the at least one input terminal and the at least one latch terminal have a same polarity.

5. The receiver latch circuit according to claim 1, wherein the input data signal is a differential input signal; the at least one input terminal includes a pair of input terminals to receive the differential input signal; and the at least one latch terminal includes a pair of latch terminals.

6. The receiver latch circuit according to claim 5, wherein the dynamic latch includes a pair of output terminals having thereon the amplified output data signal, with the pair of output terminals being the pair of latch terminals and the amplified output data signal being a differential output data signal.

7. The receiver latch circuit according to claim 5, wherein the evaluation circuit has the pair of input terminals to receive the differential input signal and a pair of sense terminals, with the pair of sense terminals being the pair of latch terminals; and the evaluation circuit being adapted to generate the sensed data signal on the pair of sense terminals based at least in part on the differential input signal.

8. The receiver latch circuit according to claim 5, wherein the at least one capacitor includes a pair of capacitors, coupled between the pair of input terminals and the pair of latch terminals.

9. The receiver latch circuit according to claim 8, wherein each of the pair of capacitors are coupled between one of the pair of input terminals and one of the pair of latch terminals having a same polarity.

10. The receiver latch circuit according to claim 8, wherein the pair of input terminals include a negative input terminal and a positive input terminal; the pair of latch terminals includes a negative latch terminal and a positive latch terminal; the pair of capacitors include a first and a second capacitor; and the first capacitor is coupled between the negative input terminal and the negative latch terminal; the second capacitor is coupled between the positive input terminal and the positive latch terminal.

11. The receiver latch circuit according to claim 10, wherein the evaluation circuit includes a first and a second transistor having
   a first and a second source, respectively, coupled to ground;
   a first and a second drain, respectively, coupled to the pair of sense terminals of the evaluation circuit; and
   a first and a second gate, respectively, coupled to a negative voltage of and a positive voltage, respectively, of the differential input signal, with the first gate being the negative input terminal and the second gate being the positive input terminal.

12. The receiver latch circuit according to claim 1, wherein a selected one of the at least one sense terminal and the at least one output terminal is the at least one latch terminal; and the at least one input terminal and the at least one latch terminal have a same polarity.

13. The receiver latch circuit according to claim 12, further comprising:
   a slave latch coupled to the dynamic latch.

14. The receiver latch circuit according to claim 12, wherein the input data signal is a low voltage swing signal and the amplified output data signal is a full rail-to-rail output signal.

15. A system, comprising:
   an integrated circuit chip including at least one receiver latch circuit, with the receiver latch circuit including
   a dynamic latch including at least one input terminal to receive an input data signal and at least one latch terminal, the dynamic latch being adapted to generate an amplified output data signal based at least in part on the input data signal;
   the dynamic latch including at least one capacitor, coupled between the at least one input terminal and the at least one latch terminal, to reduce intersymbol interference in the input data signal;
   the dynamic latch further including an evaluation circuit having the at least one input terminal and at least one sense terminal and adapted to generate a sensed data signal on the at least one sense terminal; an amplifying circuit, coupled to the at least one sense terminal and including at least one output terminal, and adapted to generate the output data signal based at least in part on the sensed data signal; and a precharge circuit, coupled to the at least one sense terminal and the at least one output terminal, to precharge the at least one sense terminal and the at least one output terminal;
   a mass storage device; and
   a bus coupled to the integrated circuit chip and the mass storage device.

16. The system according to claim 15, wherein the integrated circuit chip is a selected one of a processor chip or a memory chip.

17. The system according to claim 15, wherein the at least one input terminal and the at least one latch terminal have a same polarity.

18. The system according to claim 15, wherein the input data signal is a differential input signal; the at least one input terminal includes a pair of input terminals to receive the differential input signal; and the at least one latch terminal is a pair of latch terminals; and the at least one capacitor includes a pair of capacitors, coupled between the pair of input terminals and the pair of latch terminals.

19. A receiver latch circuit, comprising:
   a dynamic latch including a negative and a positive input terminal to receive a differential input data signal and a negative and a positive latch terminal, the dynamic latch being adapted to generate an amplified output data signal based at least in part on the differential input data signal;
   the dynamic latch further including a first and a second capacitor to reduce intersymbol interference in the input data signal, with the first capacitor being coupled between the negative input terminal and the negative latch terminal and the second capacitor being coupled between the positive input terminal and the positive latch terminal;
   the dynamic latch further including an evaluation circuit having a pair of sense terminals, with the evaluation circuit including a first and a second transistor having
   a first and a second source, respectively, coupled to ground;
   a first and a second drain, respectively, coupled to the pair of sense terminals of the evaluation circuit; and
   a first and a second gate, respectively, coupled to a negative voltage of and a positive voltage, respectively, of the differential input signal, with the first gate being the negative input terminal and the second gate being the positive input terminal.

* * * * *